United States Patent [19]

Barbara

[11] Patent Number: 5,545,994
[45] Date of Patent: Aug. 13, 1996

[54] REDUCTION OF AMBIENT SUSCEPTIBILITY PERTURBATIONS OF AN NMR SPECTROMETER

[75] Inventor: Thomas M. Barbara, Cupertino, Calif.

[73] Assignee: Varian Associates, Inc., Palo Alto, Calif.

[21] Appl. No.: 433,637

[22] Filed: May 2, 1995

[51] Int. Cl.$^6$ .................................................. G01V 3/00
[52] U.S. Cl. ........................................ 324/315; 324/321
[58] Field of Search ................................ 324/315, 317, 324/321, 318, 306, 307, 309

[56] References Cited

U.S. PATENT DOCUMENTS

| | | | |
|---|---|---|---|
| 3,091,732 | 5/1963 | Anderson et al. | 324/0.5 |
| 4,266,194 | 5/1981 | Hlavka | 324/315 |
| 4,461,996 | 7/1984 | Kwon | 324/315 |
| 5,096,826 | 3/1992 | Barbic et al. | 324/317 |

*Primary Examiner*—Louis M. Arana
*Attorney, Agent, or Firm*—Edward Berkowitz

[57] ABSTRACT

The volume magnetic susceptibility of an NMR probe is established and maintained at a desired value, such as a value characterizing other components of the probe, by a linear combination of partial pressures of respective fluids introduced into the sensitive volume of the probe.

5 Claims, 5 Drawing Sheets

FIG. 5
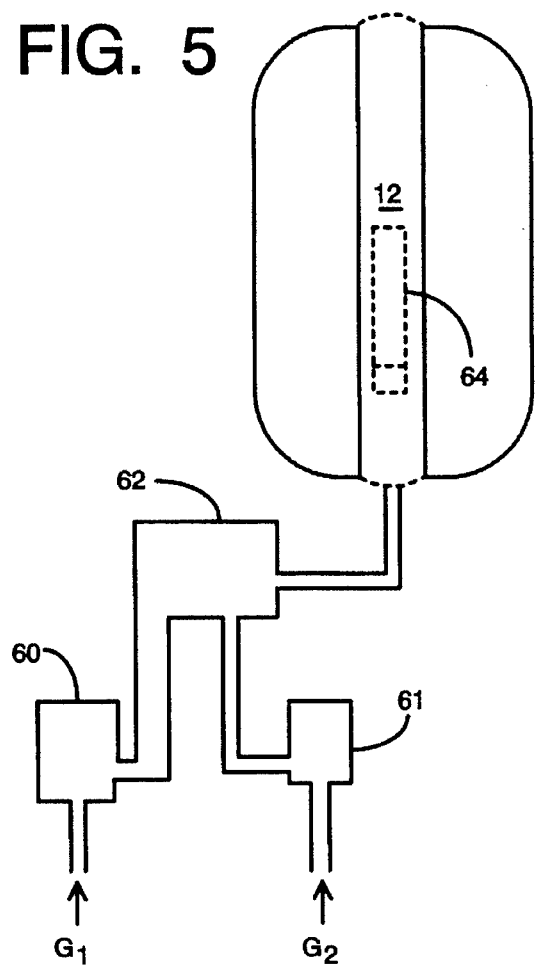
FIG. 7
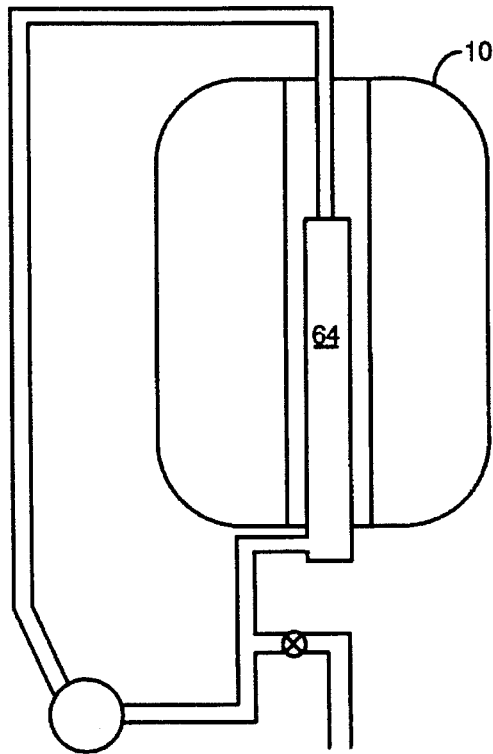
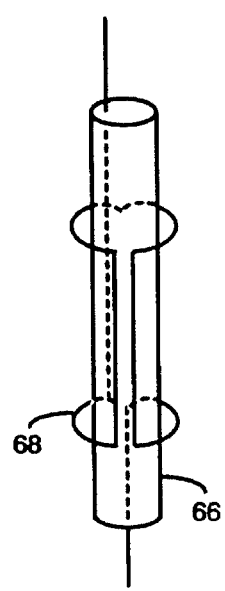
FIG. 6

5,545,994

REDUCTION OF AMBIENT SUSCEPTIBILITY PERTURBATIONS OF AN NMR SPECTROMETER

FIELD OF THE INVENTION

The present invention relates generally to analytic instrumentation based upon magnetic resonance phenomena and particularly relates to reduction of magnetic perturbations due to ambient conditions in the probe of an NMR spectrometer.

BACKGROUND OF THE INVENTION

The precision with which samples are analyzed via NMR has progressed to the point where one part in $10^9$ is routinely achieved. The limits to attainable precision include inhomogeneities in applied magnetic fields, noise of various sources, environmental instability and simple asymmetry in structural aspects of the NMR probe. In particular, the structural aspects of the spectrometer components defining and occupying the sensitive region of the NMR probe include the finite magnetic susceptibility of the materials forming the RF coil intrinsically defining the sensitive region. This may include conductors, support forms, adhesives, solder and the like. Measures to reduce inhomogeneities from this type of perturbation are discussed by Anderson, et al. in U.S. Pat. No. 3,091,732 where it was sought to provide susceptibility matched materials and bonding agents for securing the desired homogeneity. These materials are required to exhibit an effective gross magnetic susceptibility approximating air in which these components are necessarily immersed. Thus this prior art may be characterized as matching the structural components of the RF probe (particularly, the coil) to the medium filling the sensitive volume. The present invention seeks to match the susceptibility of the medium to the se same structural components.

The attempt to control matching of susceptibility in solid components of the RF probe will largely be effective at fixed temperature and temperature variation will also vary the volume susceptibility of the surrounding fluid, viz. gas or liquid medium.

In the present invention it is recognized that the presence of particular gasses or liquids in the sensitive region can be a source of magnetic perturbation. These gasses include cryogenic vapors issuing from the magnet cryostat and perhaps from a separate cryostat housing the probe, viz., nitrogen and helium. These cryogenic gasses are vented from the cryostat and settle or permeate the environment. One may also have unspecified gasses employed for the high speed spinner commonly utilized in high resolution NMR spectroscopy.

SUMMARY OF THE INVENTION

In the present invention a mixture of at least two fluids of disparate specific magnetic susceptibility are introduced into the sensitive volume at respective partial pressures selected to achieve a net desired volume magnetic susceptibility, preferably matching the volume susceptibility of the solid components.

BRIEF DESCRIPTION OF THE DRAWINGS

FIG. 5 illustrates a gas flow arrangement for the preferred embodiment of the invention.

FIG. 6 shows a sealed sample within an RF coil.

FIG. 7 is an example of a recirculating arrangement for susceptibility matched gasses.

DETAILED DESCRIPTION OF THE INVENTION

Figure 1:
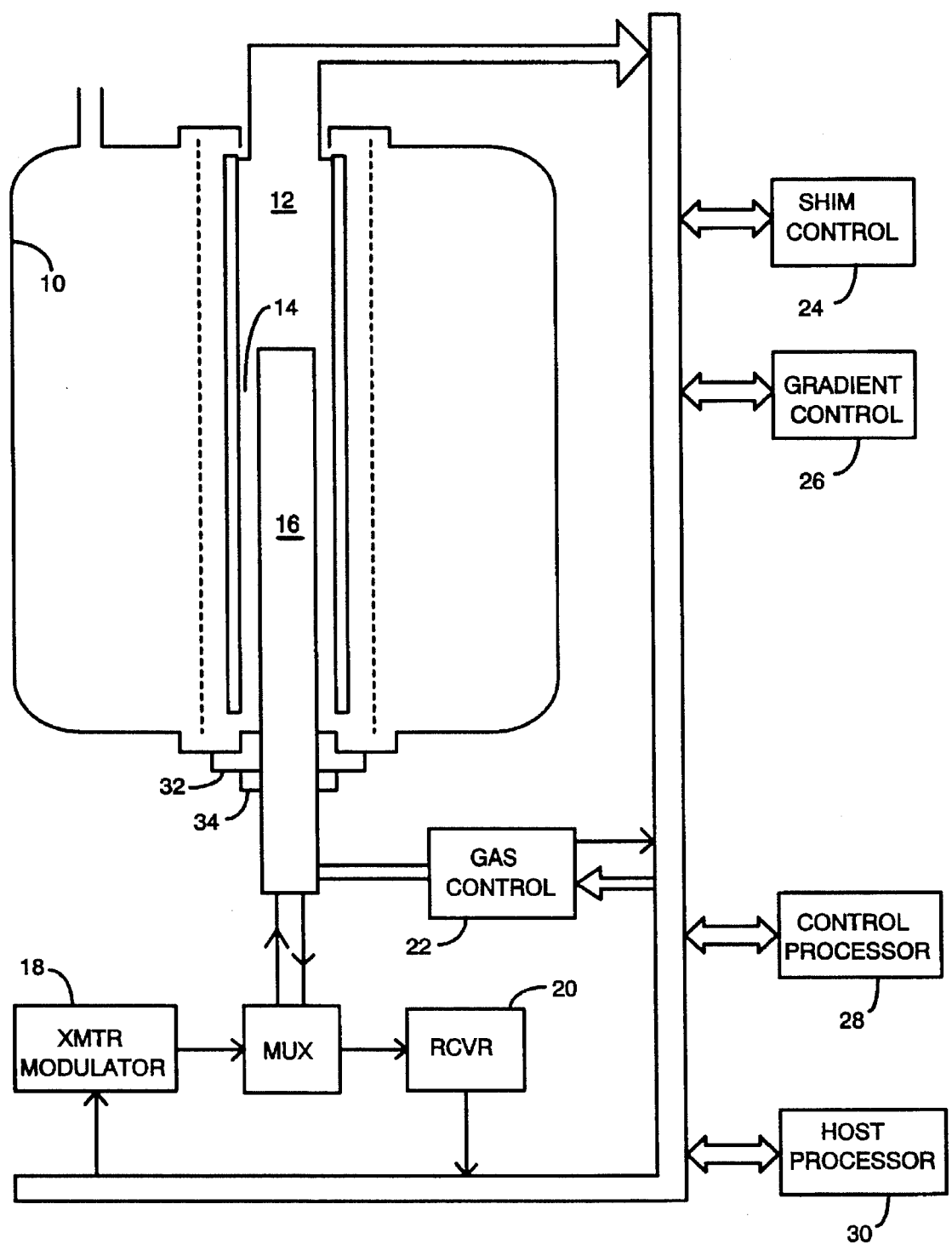
FIG. 1 shows a typical NMR spectrometer in block diagram form

Turning now to FIG. 1, a cryostat 10 houses a superconducting magnet (not shown) for maintaining a polarizing magnetic field in the bore 12 of the cryostat. The bore 12 houses room temperature shim coils for correcting residual errors in the polarizing magnetic field and gradient coils for establishing desired controllable gradients of the magnetic field. Shim coils and gradient coils are represented schematically and collectively as coils 14 disposed in the (room temperature) periphery of bore 12. The probe housing 16 contains one or more tuned circuits for excitation of the sample (not shown) from one (or more) RF sources such as transmitter/modulator 18 and for coupling the resonant signal emitted from the sample through multiplexor 19 to the receiver 20. The probe may also contain apparatus for spinning the sample usually by pneumatic means and for maintaining desired thermal conditions. These are represented symbolically by gas controller 22. The shim and gradient coils 14 are respectively responsive to shim controller 24 and gradient controller 26. A Control processor 28 manages the operation of the instrument and subsystems and host processor 30 manages interface activities originating with or directed to the user and the treatment, organization, display and interpretation of data.

Figure 2:
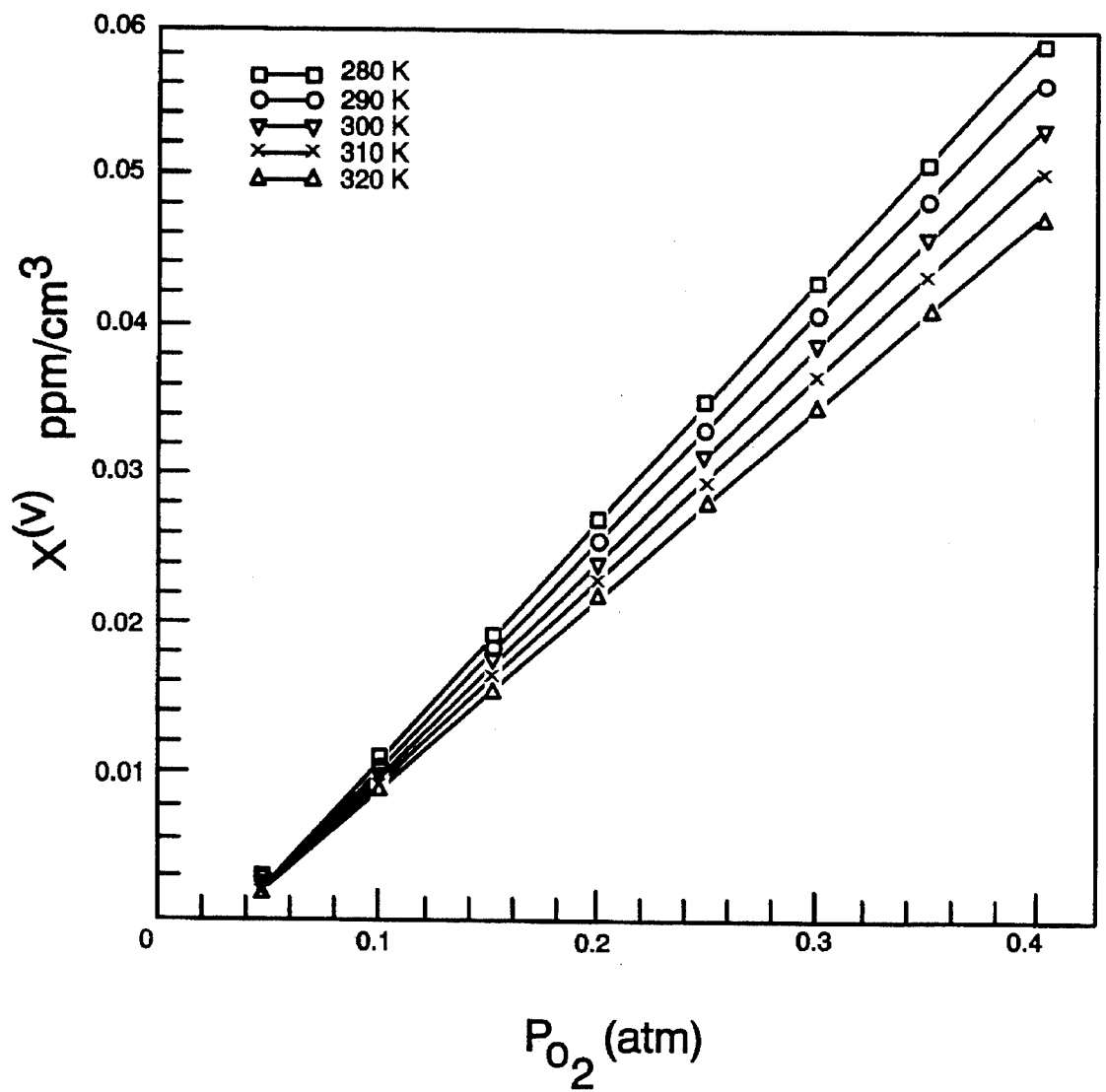
FIG. 2 shows the measurements of volume susceptibility of $O_2$ - $N_2$.

The magnetic susceptibility of fluids such as atmospheric gases can be regarded as a source of magnetic perturbation surrounding the sample of interest within the RF probe. In similar fashion, (for gaseous fluids) the present invention seeks to control the partial pressures of the ambient gaseous environment within the RF probe thereby to establish and maintain the resulting volume magnetic susceptibility. FIG. 2 demonstrates the magnetic properties of pure $N_2$ and ordinary atmospheric $N_2$ (78%)- $O_2$ over a range of applied magnetic field. The two gaseous environments are seen to exhibit rather different behavior.

Particular compositional mixtures were examined for different temperatures at constant one atmosphere total pressure and the results are shown in FIG. 2. It is common to seek a susceptibility match between solid components and air (about 0.026 ppm/cm$^3$). The data of FIG. 2 show that the desired value can be sustained over a range of about 0.0175 to 0.021 for a temperature range from 280 K° to 320 K°.

Figure 3:
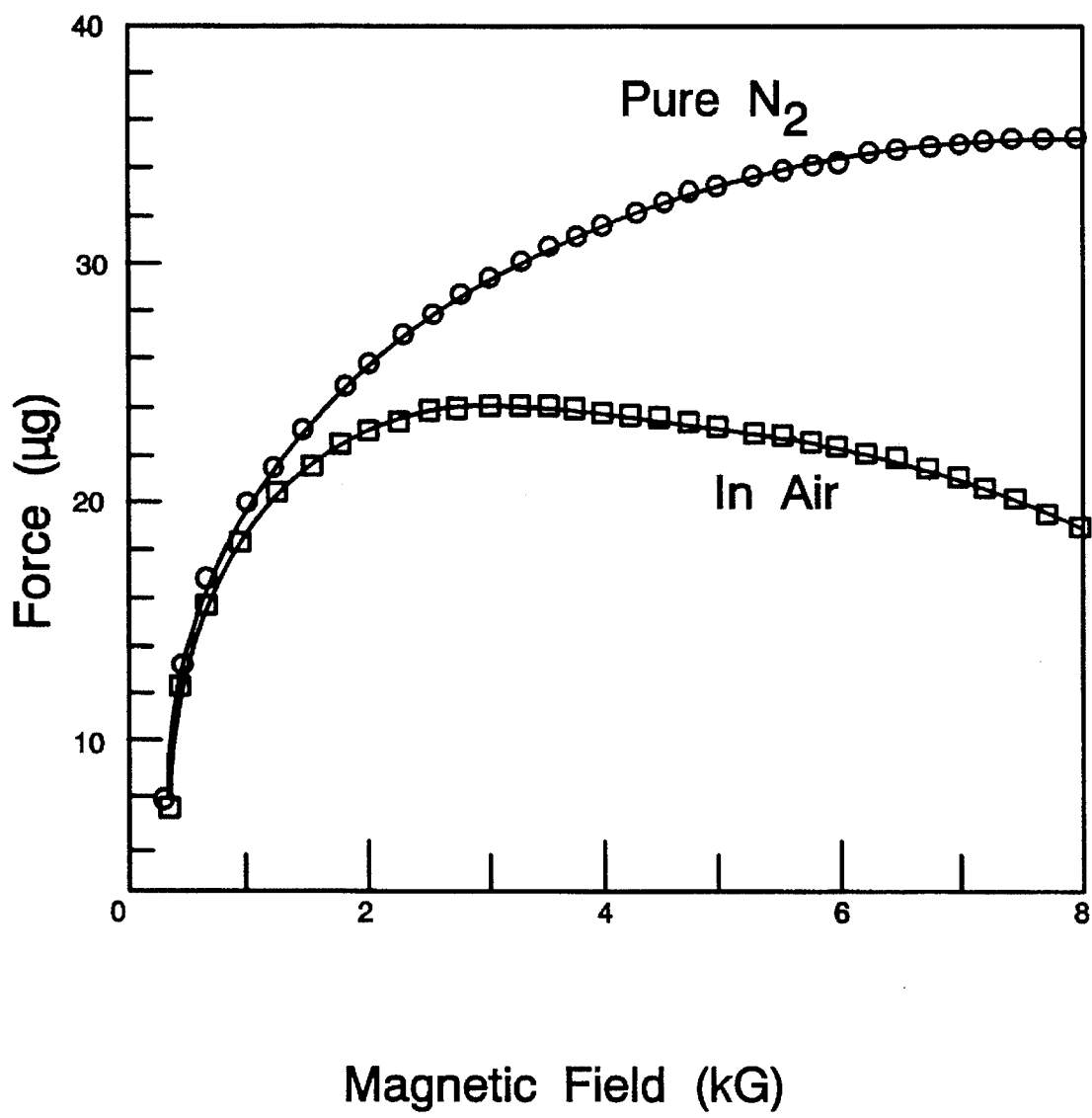
FIG. 3 shows a force magnetometer measurement of the variation of magnetic properties of two $O_2$—$N_2$ mixtures.

Turning now to FIG. 3, there is shown force magnetometer measurements obtained over a range of magnetic field where the measurements are "in air" in the one case and pure nitrogen for comparison.

Figure 4A:
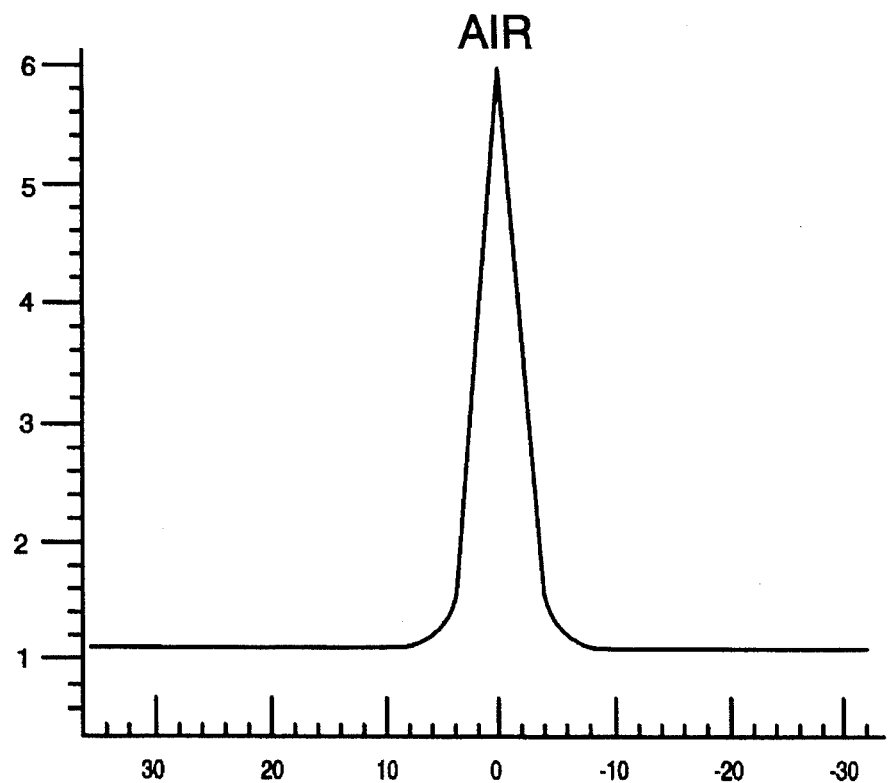
FIG. 4A shows a lineshape for a proton resonance in water wherein the probe is filled with air.
Figure 4B:
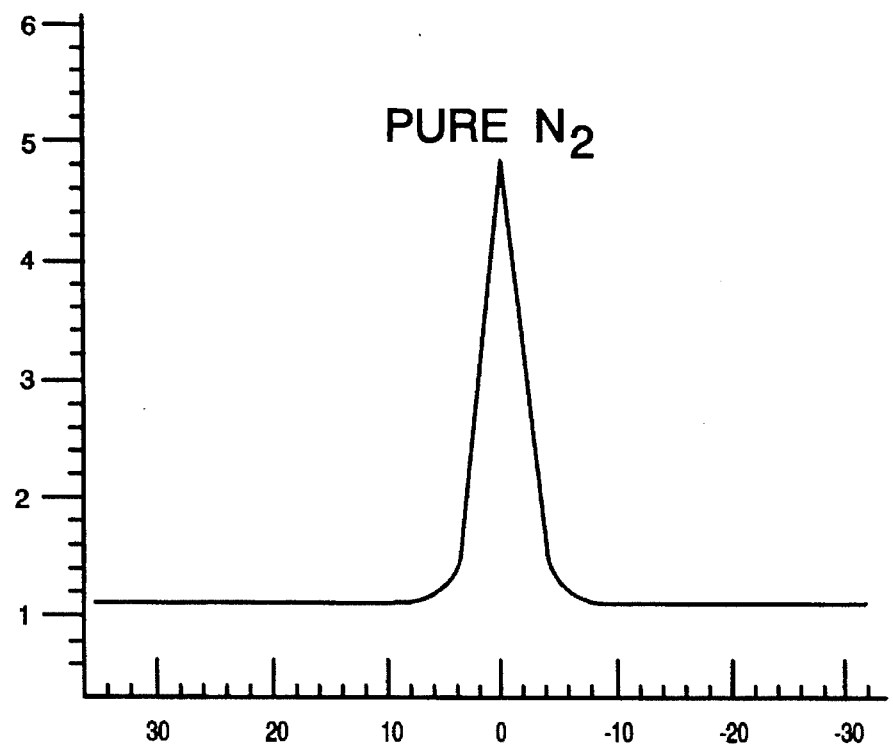
FIG. 4B shows a lineshape for a proton resonance in water wherein the probe is filled with nitrogen.

FIGS. 4A and 4B show the lineshape of a proton resonance in water under respective conditions where air, and where nitrogen form the gaseous environment in which the measurement is made.

In the alternative preferred embodiments, $N_2$ and $O_2$ are each directed to a mixing plenum in selected partial pressures to achieve the desired volume magnetic susceptibility and the mixture is then introduced in a flow regime through either of the RF probe or the magnet bore. FIG. 5 shows an arrangement wherein gasses G1 and G2 are introduced in selected proportion through mass flow controllers 60 and 61 to a plenum 62 wherein the mixing is completed and thence introduced to the bore of a superconducting magnet. The gas is permitted to suffuse the entire interior bore structure particularly including the RF probe 64. Thus, while it is difficult to manipulate the composition of an item comprising the RF probe 64, such as a coil, it is quite easily realized to mask the susceptibility of that item by the use of a selected (non-corrosive) gas.

In another embodiment of the invention, gases which are expensive or noxious may be employed as in FIG. 6 where vessels 66 are sealed off and which vessels are themselves carefully matched in susceptibility to the surrounding coil structure 68.

In yet another embodiment, gasses which are introduced to the magnet bore may be pressurized or recirculated in the bore structure, such structure having been adapted as in FIG. 7 in a straightforward manner to permit such pressurization or re-circulation.

Although this invention has been described with reference to particular embodiments and examples and specific examples have been drawn to gaseous fluids, other modifications and variations will occur to those skilled in the art in view of the above teachings. It should be understood that within the scope of the appended claims, this invention may be practiced otherwise than as specifically described and many modifications are possible in the exemplary embodiments without materially departing from the novel teachings and advantages of the invention. In the claims, means-plus-function clauses are intended to cover the structures defined herein as performing the recited function and not only structural equivalents, but also, equivalent structures.

What is claimed is:

1. An NMR apparatus for examining the constituents of an object, said object enclosed within a sensitive volume defined by rf probe apparatus, comprising first fluid introduction regulator for maintaining a partial concentration of said first fluid at partial concentration $P_1$ within said sensitive volume, second fluid introduction regulator for maintaining a partial concentration of said second fluid at partial concentration $P_2$ within said sensitive volume, said first and second fluids respectively having molar magnetic susceptibilities of $x_1$ and $x_2$ whereby the volume susceptibility of the resulting fluid mixture within said sensitive volume is a linear combination of said molar magnetic susceptibilities and exhibits a desired value.

2. The NMR apparatus of claim 1 wherein the number of fluids which are mixed to obtain said desired volume susceptibility is at least two.

3. The NMR apparatus of claim 1 wherein said desired value is substantially the magnetic susceptibility of a portion of the structural members forming said sensitive volume.

4. The NMR apparatus of claim 1 wherein said sensitive volume is in the interior of the bore of a superconducting magnet and said fluid mixture is allowed to flow through said bore and escape therefrom.

5. The NMR apparatus of claim 1 wherein said sensitive volume is in the interior of the bore of a superconducting magnet and said fluid mixture is allowed to flow through said bore and recirculate therethrough.

\* \* \* \* \*